United States Patent
Barrenscheen

(10) Patent No.: US 11,327,097 B2
(45) Date of Patent: May 10, 2022

(54) VOLTAGE MEASUREMENT THROUGH REFERENCE CIRCUIT BASED IMPEDANCE DETECTION

(71) Applicant: Infineon Technologies AG, Neubiberg (DE)

(72) Inventor: Jens Barrenscheen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 3 days.

(21) Appl. No.: 16/914,868

(22) Filed: Jun. 29, 2020

(65) Prior Publication Data

US 2021/0003618 A1    Jan. 7, 2021

(30) Foreign Application Priority Data

Jul. 1, 2019  (DE) .......................... 102019117673.5

(51) Int. Cl.
*G01R 19/00*    (2006.01)
(52) U.S. Cl.
CPC ................ *G01R 19/0038* (2013.01)
(58) Field of Classification Search
CPC .............. G01R 19/0038; G01R 15/144; G01R 19/0084; G01R 19/16504
See application file for complete search history.

(56) References Cited

U.S. PATENT DOCUMENTS

| 2010/0231239 | A1* | 9/2010 | Tateishi ............... G01P 15/125 324/672 |
| 2014/0159735 | A1 | 6/2014 | Buzon et al. |
| 2014/0210459 | A1* | 7/2014 | Piastowski ............ G01R 29/00 324/227 |
| 2014/0300374 | A1 | 10/2014 | McKenzie et al. |
| 2017/0336469 | A1* | 11/2017 | Lamesch ............ G01R 31/2829 |

FOREIGN PATENT DOCUMENTS

| WO | 2014079502 A1 | 5/2014 |
| WO | 2018005631 A1 | 1/2018 |

* cited by examiner

*Primary Examiner* — Tung X Nguyen
*Assistant Examiner* — Feba Pothen
(74) *Attorney, Agent, or Firm* — Slater Matsil, LLP

(57) ABSTRACT

A circuit for measurement of a voltage comprises a passive sensing element configured to be coupled between a measurement point and a reference point. The passive sensing element has a voltage-dependent impedance. Further, the circuit comprises an impedance detector and a reference circuit. The impedance detector is configured to detect the impedance of the passive sensing element by providing a probe signal to the passive sensing element and evaluating a response to the probe signal from the passive sensing element and a reference response from the reference circuit. Further, the circuit comprises a converter circuit configured to convert a result of evaluating the response and the reference response to a voltage level information.

25 Claims, 6 Drawing Sheets

VOLTAGE MEASUREMENT THROUGH REFERENCE CIRCUIT BASED IMPEDANCE DETECTION

This application claims the benefit of German Patent Application No. 102019117673.5, filed on Jul. 1, 2019, which application is hereby incorporated herein by reference in its entirety.

TECHNICAL FIELD

The present application relates to a circuit for measuring a voltage and to a method of measuring a voltage.

BACKGROUND

In many applications, there is the need to measure or monitor a voltage. For this purpose, various types of measurement circuits may be used, e.g., based on an analog-to-digital (AD) converter, with or without input signal conditioning, filtering, offsets, resistive dividers, or the like. However, more complex measurement circuits may be needed in scenarios the measurement of the voltage needs to be performed in a first voltage domain while the measurement result needs to be provided to a second voltage domain which is separated from the first voltage domain. For example, the first voltage domain and the second voltage domain may use different reference potentials. For example, the first voltage domain may be a high voltage domain, and the second voltage domain may be a low voltage domain which needs to be isolated from the first voltage domain, e.g., for safety reasons or because circuit components in the low voltage domain are not compatible with voltages in the high voltage domain.

For example, WO 2018/005631 A1 describes wireless sensing for a battery system in which a cell measurement circuit measures a voltage at terminals of a battery module. A wireless communication transceiver is used to transmit the voltage measurement information from the cell measurement circuit to a battery controller.

U.S. Publication No. 2014/0159735 A1 describes monitoring of voltage outputs of cells of an electrochemical generator in an indirect manner, using a reactive passive component, the impedance of which varies depending on the voltage to be monitored. The passive reactive component is part of a resonant circuit, and the voltage is monitored indirectly by detecting a variation of a resonant frequency of the resonant circuit.

However, the above-mentioned technologies using wireless transmission of measurement information or detection of variations of a resonant frequency result in high complexity of the measurement circuit.

Accordingly, there is a need for techniques which allow for efficient measurement of a voltage in a separated voltage domain.

SUMMARY

According to an embodiment, a circuit for measuring a voltage is provided. The circuit comprises a passive sensing element configured to be coupled between a measurement point and a reference point. The passive sensing element has a voltage-dependent impedance. For example, the passive sensing element may comprise a varactor, a varicap diode, and/or a field effect transistor. Further, the circuit comprises an impedance detector and a reference circuit. The impedance detector is configured to detect the voltage-dependent impedance of the passive sensing element by providing a probe signal to the passive sensing element and evaluating a response to the probe signal from the passive sensing element with respect to a reference response from the reference circuit. Further, the circuit comprises a converter circuit configured to convert a result of evaluating the response and the reference response to a voltage level information.

According to an embodiment of the circuit, the impedance detector provides the probe signal also to the reference circuit. The reference response may then be a further response to the probe signal from one or more circuit elements of the reference circuit. The further response may be measured during regular operation of the circuit, e.g., substantially at the same time as the response from the passive sensing element.

According to a further embodiment of the circuit, the reference response may be based on a previous measurement and stored in the reference circuit. For example, the reference response may be measured and stored during a calibration phase in which one or more known voltages are applied to the passive sensing element and one or more corresponding responses to the probe signal are measured and then stored to be used as reference response.

According to an embodiment of the circuit, the probe signal has a constant frequency. The frequency of the probe signal may be selectable from a plurality of frequencies.

According to an embodiment of the circuit, the probe signal is a pulse signal.

According to an embodiment of the circuit, the impedance detector is configured to evaluate the response and the reference response by determining a difference between the response and the reference response.

According to an embodiment of the circuit, the converter circuit is configured to determine the voltage level information by mapping the determined difference between the response and the reference response to a corresponding voltage level information.

According to an embodiment of the circuit, the difference between the response and the reference response comprises a phase difference.

According to an embodiment of the circuit, the circuit comprises a coupling circuit configured to allow passage of the probe signal from the impedance detector to the passive sensing element and to provide direct current decoupling between the passive sensing element and the impedance detector.

According to an embodiment of the circuit, the coupling circuit is configured to capacitively couple the passive sensing element and the impedance detector. In addition or as an alternative, the coupling circuit may be configured to inductively couple the passive sensing element and the impedance detector.

According to an embodiment, the circuit may further comprise a voltage divider for coupling the passive sensing element between the measurement point and the reference point.

According to an embodiment of the circuit, the reference circuit is configured to replicate an impedance of the coupling circuit.

According to an embodiment, the reference circuit is configured to store a result of a previous measurement and to output the reference response based on the stored result of the previous measurement.

According to a further embodiment, a method of measuring a voltage is provided. The method comprises coupling a passive sensing element between a measurement point and a reference point. The passive sensing element has a voltage-dependent impedance. For example, the passive sensing element may comprise a varactor, a varicap diode, and/or a field effect transistor. Further, the method comprises providing a probe signal to the passive sensing element. Further, the method comprises receiving a response to the probe signal through the coupling circuit from the passive sensing element and receiving a reference response from a reference circuit. Further, the method comprises detecting the impedance of the passive sensing element by evaluating the response and the reference response. Further, the method comprises converting a result of said evaluating the response and the reference response to a voltage level information.

According to an embodiment of the method, the probe signal has a constant frequency. The frequency of the probe signal may be selectable from a plurality of frequencies.

According to an embodiment of the method, the probe signal is a pulse signal.

According to an embodiment, the method further comprises evaluating the response and the reference response by determining a difference between the response and the reference response.

According to an embodiment, the method further comprises determining the voltage level information by mapping the determined difference between the response and the reference response to a corresponding voltage level information.

According to an embodiment of the method, the difference between the response and the reference response comprises a phase difference.

According to an embodiment of the method, coupling the passive sensing element between the measurement point and the reference point circuit may be accomplished through a voltage divider.

According to an embodiment of the method, the method further comprises providing the probe signal through a coupling circuit to the passive sensing element. In this case, the coupling circuit may provide DC decoupling with respect to the passive sensing element.

According to an embodiment of the method, the reference circuit replicates an impedance of the coupling circuit. The impedance detector may provide the probe signal also to the reference circuit. The reference response may then be received as a further response to the probe signal from one or more circuit elements of the reference circuit. The further response may be measured during regular operation of the circuit, e.g., substantially at the same time as the response from the passive sensing element.

According to an embodiment of the method, the reference response is based on a result of a previous measurement. The result of the previous measurement and/or the reference response may be stored in the reference circuit. For example, the reference response may be measured and stored during a calibration phase in which one or more known voltages are applied to the passive sensing element and one or more corresponding responses to the probe signal are measured and then stored to be used as reference response.

The above summary is merely intended to give a brief overview over some embodiments and is not to be construed as limiting, as other embodiments may employ other features.

DETAILED DESCRIPTION OF ILLUSTRATIVE EMBODIMENTS

Figure 1:
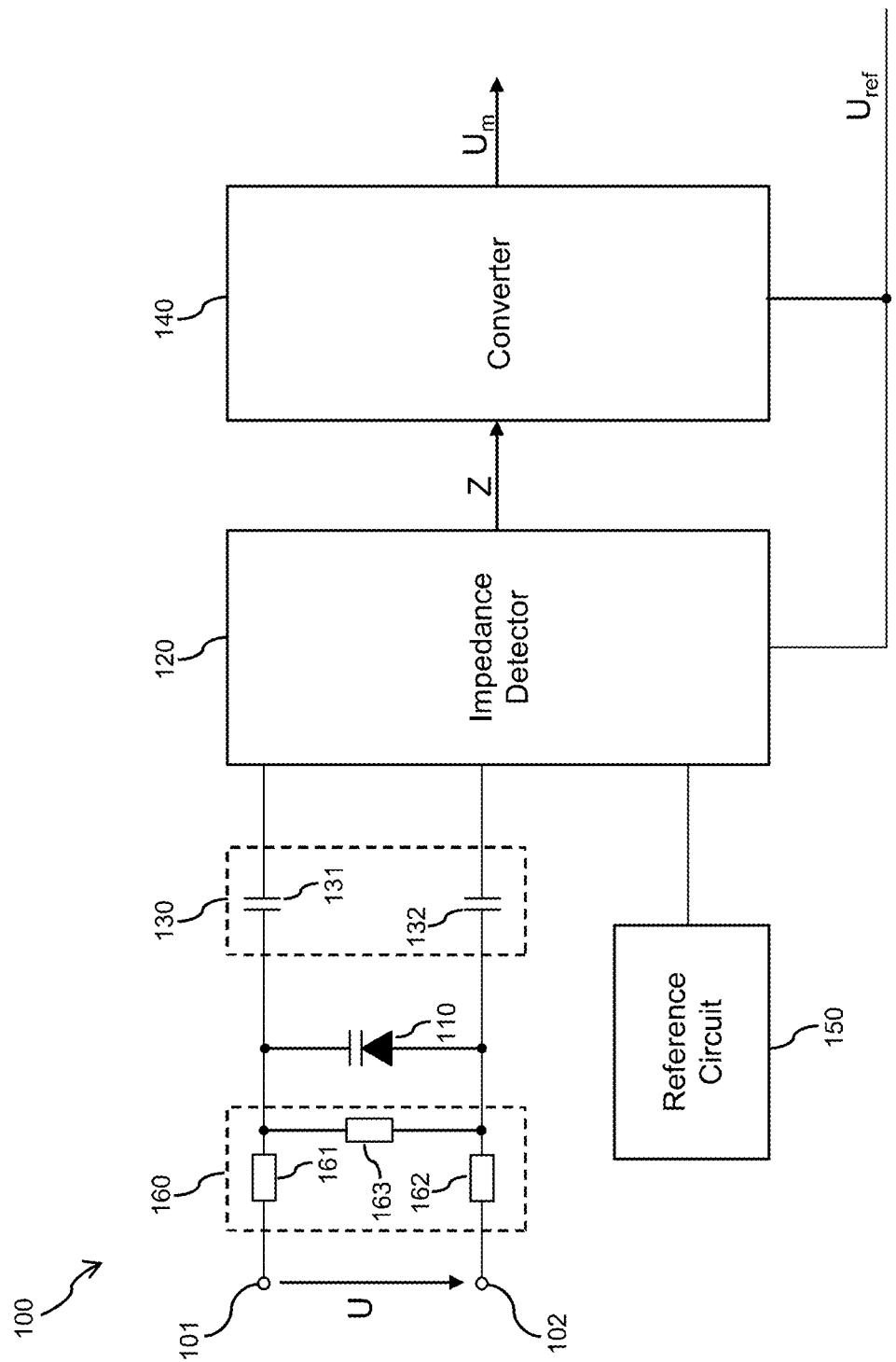
FIG. 1 illustrates a voltage measurement circuit according to an embodiment.

In the following, various embodiments will be discussed referring to the attached drawings. It should be noted that these embodiments are given as illustrative examples only and are not to be construed as limiting. For example, while embodiments may be described as comprising a plurality of features or elements, this is not to be construed as indicating that all these features or elements are necessary for an implementation. Instead, in other embodiments, some of these features or elements may be omitted, and/or may be replaced by alternative features or elements. In addition to the features or elements explicitly shown in the drawings or described herein, other features or elements, for example features or elements used in conventional power supply circuits, may be provided.

FIG. 1 illustrates a measurement circuit 100 for measuring a voltage U between a measurement point 101 and a reference point 102. The measurement point 101 and the reference point 102 may correspond to terminals of a circuit or circuit component, e.g., terminals of a battery, or to various kinds of internal or external circuit node.

In the illustrated example, the measurement circuit 100 is provided with a passive sensing element 110, an impedance detector 120, an alternating current (AC) coupling circuit 130, a converter 140, a reference circuit 150, and a direct current (DC) coupling circuit 160. Although FIG. 1 illustrates the impedance detector 120, the AC coupling circuit 130, the converter 140, and the reference circuit 150 as separate components, it is noted that functionalities of the illustrated components could also be combined. For example, the reference circuit 150 could be implemented as an additional functionality of the impedance detector 120.

The passive sensing element 110 has a voltage-dependent impedance Z. For example, the passive sensing element 110 may correspond to or include a varactor, a varicap diode, a high-voltage diode, a field effect transistor, e.g., a power MOS (Metal Oxide Semiconductor) field effect transistor. In the latter case, a drain-source capacitance may vary depending on a voltage applied between drain and source of the power MOS field effect transistor. In some scenarios, the passive sensing element 110 may also include a combination of two or more of the above-mentioned circuit elements.

By means of the DC coupling circuit 160, the passive sensing element 110 is coupled between the measurement point 101 and the reference point 102. As illustrated, the DC coupling circuit 160 includes a first resistor 161 and a second resistor 162. The first resistor 161, the passive sensing element 110, and the second resistor 162 are connected in series between the measurement point 101 and the reference point 102. In some examples, the DC coupling circuit 160 may further include a voltage divider configured to apply a certain portion of the voltage U between the measurement point 101 and the reference point 102 to the passive sensing element no. The voltage divider may for example be implemented by an optional further resistor 163 coupled in parallel to the passive sensing element 110. The resistance values of the resistors 161, 162 may be in the range of 50 kΩ to 500 kΩ, e.g., about 100 kΩ. Together with the capacitance of the passive sensing element 110, the resistors 161, 162 may form a low-pass filter. As a result, a current flowing between the measurement point 101 and the reference point 102 through the measurement circuit 100 may be minimized. It is noted that other implementations of the DC coupling circuit 160 could be used as well. For example, at least one of the resistors 161, 162 could be omitted.

Due to the coupling of the passive sensing element 110 to the measurement point 101 and the reference point 102, the impedance Z of the passive sensing element 110 varies depending on the voltage U between the measurement point 101 and the reference point 102. The impedance detector 120 is configured to detect the variable impedance Z of the passive sensing element 110. For this purpose, the impedance detector 120 is coupled through the AC coupling circuit 130 to the passive sensing element 110. The AC coupling circuit 130 is configured to provide AC coupling of the passive sensing element 110 and the impedance detector 120. At the same time, the AC coupling circuit 130 is configured to provide DC decoupling of the passive sensing element 110 and the impedance detector 120. In the example of FIG. 1, the impedance detector 120 and the converter 140 are connected to a reference potential $U_{ref}$, e.g., a supply voltage chain, and the measurement point 101 and the reference point 102, and the passive sensing element 110 have no DC coupling to this reference potential $U_{ref}$.

Accordingly, the measurement point 101 and the reference point 102 may be arranged in a first voltage domain, while the impedance detector 120 is arranged in a second voltage domain which is separated, e.g., galvanically or otherwise isolated, from the first voltage domain. For example, the first voltage domain could be a high voltage domain with the voltage U between the measurement point 101 and the reference point 102 being in the range of up to 400V to 800V. As compared to that, the impedance detector 120 and the converter 140 are operated at lower voltages, e.g., in the range of 5V to 50V, such as 12V. Since the measurement circuit 100 uses only passive components in the first voltage domain, no power supply in the first voltage domain is required.

Figure 4:
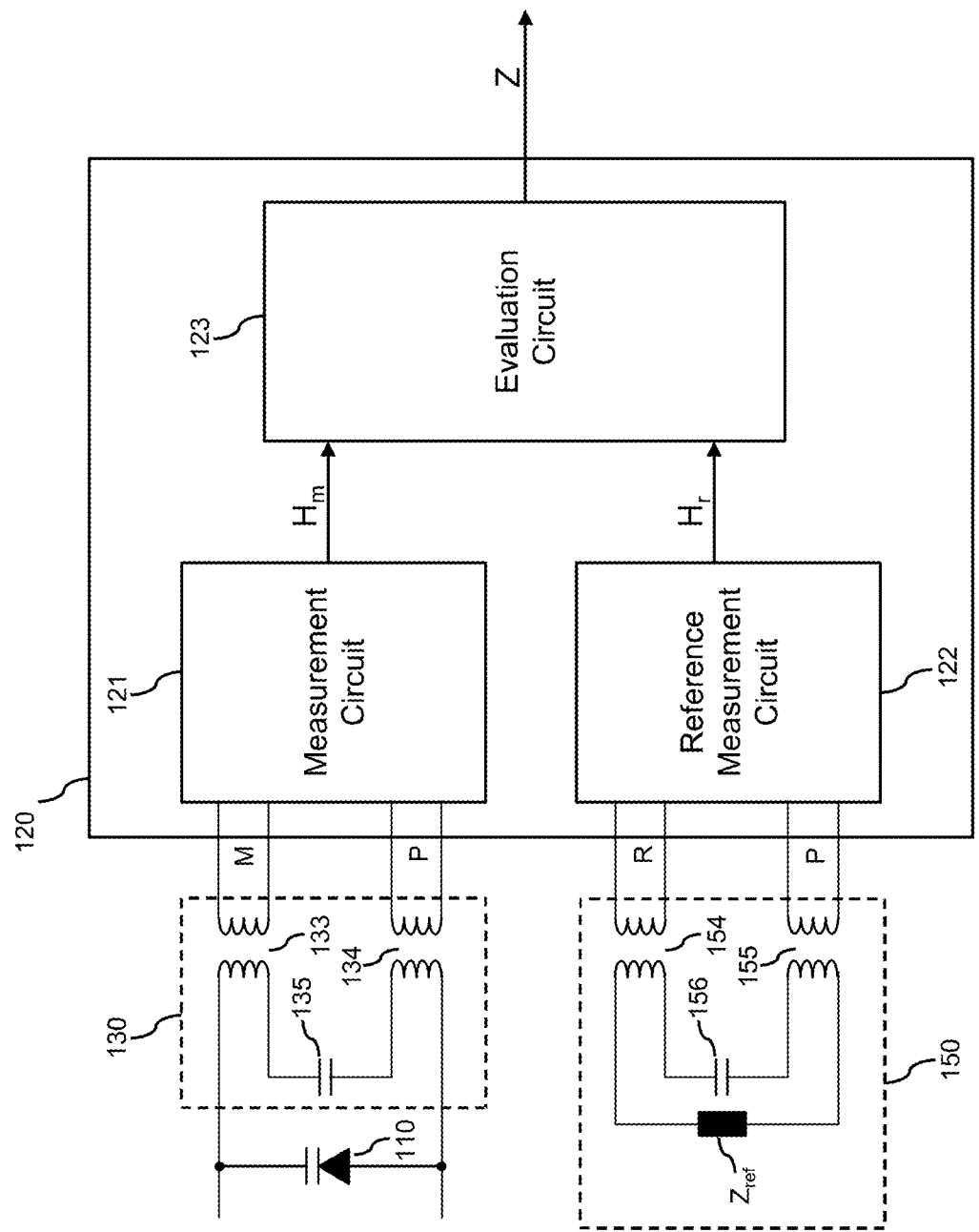
FIG. 4 shows a still further embodiment of impedance detection in the voltage measurement circuit.

In the illustrated example, the AC coupling circuit 130 includes a first capacitor 131 and a second capacitor 132. The first capacitor 131 connects a first terminal of the passive sensing element 110 to the impedance detector 120. The second capacitor 132 connects a second terminal of the passive sensing element 110 to the impedance detector 120. Accordingly, in the example of FIG. 1, the AC coupling circuit 130 is based on capacitive coupling of passive sensing element 110 to the impedance detector 120. However, it is noted that inductive coupling could be used as an alternative or in addition. FIG. 4 shows an example of a configuration in which the AC coupling circuit 130 is based on inductive coupling.

In the illustrated example, the impedance detector 120 may be configured to detect the impedance Z of the passive sensing element 110 in the following way: The impedance detector 120 provides a probe signal through the AC coupling circuit 130 to the passive sensing element 110 and to the reference circuit 150. The probe signal may be a pulse signal, in particular a rectangular pulse signal. The pulse signal may be formed of a sequence of pulses with constant frequency. Alternatively, the pulse signal could also be formed of a single pulse. Further, the impedance detector 120 receives a first response to the probe signal through the AC coupling circuit 130 from the passive sensing element 110, and receives a second response to the probe signal from the reference circuit 150. The second response is herein also referred to as a reference response. The impedance detector 120 may then determine the impedance Z by evaluating the first response and the second response. In particular, the impedance detector 120 may evaluate a difference between the first response and the second response.

In a modified example, the reference circuit 150 may provide the second response based on stored information from a previous measurement, e.g., during a calibration phase with known voltages applied to the passive sensing element 110 or to circuit elements of the reference circuit 150. The second response may then be based on information stored in a memory of the reference circuit 150.

As mentioned above, the impedance detector 120 may operate with a constant frequency of the probe signal, i.e., variations of the frequency of the probe signal are not required to estimate the impedance. However, in some scenarios, the constant frequency of the probe signal could be selectable or adjustable, e.g., with the purpose of reducing impact of different sources of noise on the measurement process. Such sources of noise could for example include another circuit generating noise in a certain frequency range. By suitably selecting the frequency of the probe signal, the measurement process may be performed with a frequency of the probe signal that avoids interference from other circuits or other sources of noise.

During measurement of the voltage U by the measurement circuit 100, the probe signal generates an AC signal at the passive sensing element 110, and the characteristics of this AC signal are determined by the impedance Z of the passive sensing element 110. For example, the impedance Z may determine a phase of the AC signal generated at the passive sensing element 110. Further, the impedance Z may determine a frequency of the AC signal generated at the passive sensing element 110. In some scenarios, the passive sensing element 110 and parts of the AC coupling circuit 130 could form an oscillator, and the AC signal generated at the passive sensing element may correspond to an oscillator signal having a frequency determined by the impedance Z.

The characteristics of the AC signal generated at the passive sensing element 110 are reflected by the first response received by the impedance detector. The first response may indicate characteristics of a transfer function $H_m$ of a circuit formed by the AC coupling circuit 130 and the passive sensing element 110. The second response may indicate characteristics of a transfer function $H_r$ of the reference circuit 150. The reference circuit 150 may replicate characteristics of the AC coupling circuit 130 and/or the passive sensing element 110 which do not depend on the voltage U between the measurement point 101 and the reference point 102.

By comparing the first response to the second response from the reference circuit, the impedance detector 120 can estimate the impedance Z. For example, a phase difference between the first response and the second response may be evaluated and the impedance Z determined from the phase difference. Further, a frequency difference between the first response and the second response may be evaluated and the impedance Z determined from the frequency difference.

The converter 140 receives the impedance Z detected by the impedance detector 120 and determines a voltage level information representing the voltage U between the measurement point 101 and the reference point 102 from the impedance Z. For this purpose, the converter 140 may use a stored mapping of impedance values to corresponding voltage level information. In the illustrated example, the voltage level information is determined in terms of a measured voltage value $U_m$, e.g., represented by a digital value. However, it is noted that other ways of representing the voltage level information corresponding to the voltage U could be used as an alternative or in addition, e.g., an indicator that the voltage U is above a certain threshold, an indicator that the voltage U is below a certain threshold, or an indicator that the voltage U is within a certain voltage range. Further, it is noted that the voltage level information may be represented in terms of a digital signal or in terms of an analog signal.

Figure 2:
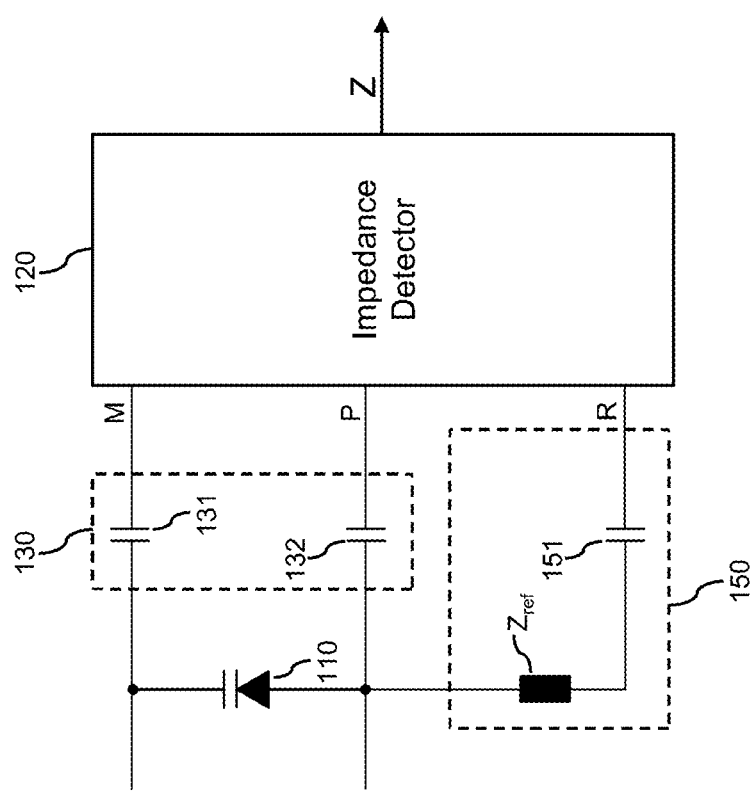
FIG. 2 shows an embodiment of impedance detection in the voltage measurement circuit.

FIG. 2 illustrates an example of implementing the detection of the impedance Z by the impedance detector 120. In the example of FIG. 2, the AC coupling circuit 130 includes the capacitors 131 and 132. The capacitor 132 couples a first terminal of the passive sensing element 110 to a probe signal terminal P of the impedance detector 120. The capacitor 131 couples the passive sensing element to a measurement signal terminal M of the impedance detector 120. In the example of FIG. 2, the reference circuit 150 includes a capacitor 151. The capacitor 151 couples the first terminal of the passive sensing element 110 to a reference terminal R of the impedance detector 120. The capacitor 151 may replicate characteristics of the capacitor 131, e.g., may have a similar capacitance. Optionally, the reference circuit 150 may also include a reference impedance $Z_{ref}$. The reference impedance $Z_{ref}$ may replicate the impedance of the passive sensing element 110 at a certain voltage U, however without depending on the voltage U between the measurement point 101 and the reference point 102.

In the example of FIG. 2, impedance detector 120 may detect the impedance Z of the passive sensing element 110 in the following way: The impedance detector 120 outputs the probe signal at the probe signal terminal P. The probe signal may for example be a rectangular pulse or sequence of rectangular pulses. Further, the impedance detector 120 receives a first response to the probe signal at the measurement terminal M and a second response to the probe signal at the reference terminal R. The first response reflects the transfer function of the circuit formed by the AC coupling circuit 130, i.e., the capacitors 131, 132, and the passive sensing element 110. The second response reflects the transfer function formed by the capacitor 132 and the capacitor 151, and, optionally, the reference impedance $Z_{ref}$. Since the capacitor 151 may replicate characteristics of the capacitor 131, the second response may reflect similar characteristics as a circuit formed of the AC coupling circuit 130 without the passive sensing element 110. The second response may thus, for example, also reflect effects of changing temperature or aging in a similar manner as the first response. In the example of FIG. 2, the impedance detector 120 may detect the impedance Z by evaluating a phase difference of the first response received at the measurement terminal and the second response received at the reference terminal.

In a modified example, the probe signal may include voltage pulses that are provided by the impedance detector 120 to terminal P, and the phase relation between the voltage pulses and resulting currents at terminal M, and, optionally, at terminal R, is used to determine the impedance Z of the passive sensing element 110. The first response and the second response may thus correspond to measured currents. In this modified example, the waveform of the voltage pulses may be a sine wave, triangular or rectangular, or a combination of different waveforms.

Figure 3:
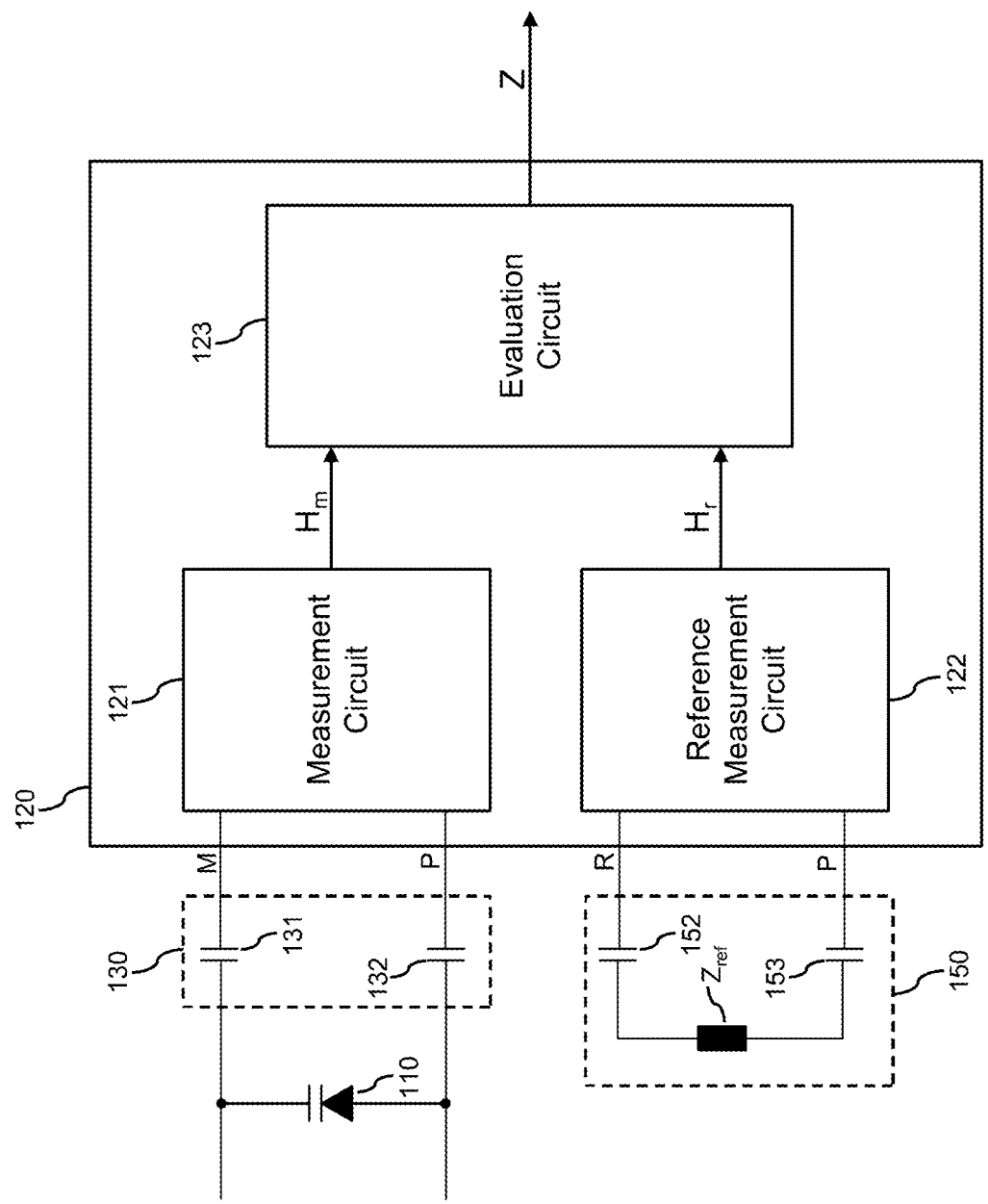
FIG. 3 shows a further embodiment of impedance detection in the voltage measurement circuit.

FIG. 3 illustrates a further example of implementing the detection of the impedance Z by the impedance detector 120. In the example of FIG. 3, the impedance detector includes a measurement circuit 121, a reference measurement circuit 122, and an evaluation circuit 123. The AC coupling circuit 130 includes the capacitors 131 and 132. The capacitor 132 couples a first terminal of the passive sensing element 110 to a probe signal terminal P of the measurement circuit 121. The capacitor 131 couples the passive sensing element to a measurement signal terminal M of the measurement circuit 121. In the example of FIG. 3, the reference circuit 150 includes a first capacitor 152 and a second capacitor 153, and, optionally, a reference impedance $Z_{ref}$. The capacitors 152, 153 couple a probe signal terminal P of the reference measurement circuit 122 to a reference terminal R of the reference measurement circuit 122. The capacitor 152 may replicate characteristics of the capacitor 131, e.g., may have a similar capacitance. The capacitor 153 may replicate characteristics of the capacitor 132, e.g., may have a similar capacitance. The optional reference impedance $Z_{ref}$ may replicate the impedance of the passive sensing element 110 at a certain voltage U, however without depending on the voltage U between the measurement point 101 and the reference point 102. It is noted that the capacitors 152, 153 could also be replaced by a single capacitor which replicates the combined characteristics of the capacitors 131, 132, e.g., a single capacitor having a capacitance corresponding to a series circuit of the capacitors 131 and 132.

In the example of FIG. 3, impedance detector 120 may detect the impedance Z of the passive sensing element 110 in the following way: the measurement circuit 121 outputs the probe signal at the probe signal terminal P of the measurement circuit 121. The probe signal may, for example, be a rectangular pulse or sequence of rectangular pulses. Further, the measurement circuit 121 receives a first response to the probe signal at the measurement terminal M of the measurement circuit 121. The reference measurement circuit 122 outputs the probe signal at the probe signal terminal P of the reference measurement circuit 122. Further, the reference measurement circuit 122 receives a second response to the probe signal at the reference terminal R of the reference measurement circuit 122. The first response reflects the transfer function $H_m$ of the circuit formed by the AC coupling circuit 130, i.e., the capacitors 131, 132, and the passive sensing element 110. The second response reflects the transfer function formed by the reference circuit 150, i.e., the capacitor 152 and the capacitor 153. Since the capacitors 152, 153 may replicate characteristics of the capacitor 131, 132, the second response may reflect similar characteristics as a circuit formed of the AC coupling circuit 130 without the passive sensing element 110. The second response may thus for example also reflect effects of changing temperature or aging in a similar manner as the first response.

In the example of FIG. 3, the measurement circuit 121 provides information on characteristics of the transfer function $H_m$ to the evaluation circuit 123. This information may, for example, include information on a phase shift, frequency shift, and/or amplitude variation of the first response with respect to the probe signal. In a similar manner, the reference measurement circuit 122 provides information on characteristics of the transfer function $H_r$ to the evaluation circuit 123. This information may, for example, include information on a phase shift, frequency shift, and/or amplitude variation of the second response with respect to the probe signal. Based on the received information, the evaluation circuit 123 determines the impedance Z of the passive sensing element 110. This may involve determining a difference between the information received from the measurement circuit 121 and the information received from the reference measurement circuit 122, e.g., a phase difference, a frequency difference, and/or an amplitude difference.

FIG. 4 illustrates another further example of implementing the detection of the impedance Z by the impedance detector 120. In the example of FIG. 4, the impedance detector includes a measurement circuit 121, a reference measurement circuit 122, and an evaluation circuit 123. The AC coupling circuit 130 includes a first transformer 133, a second transformer 134, and a capacitor 135. A first side of the transformer 134 is coupled to a probe signal terminal P of the measurement circuit 121, and a second side of the transformer 134 is coupled to a first terminal of the passive sensing element 110. A first side of the transformer 133 is coupled to a measurement signal terminal M of the measurement circuit 121, and a second side of the transformer 133 is coupled to a second terminal of the passive sensing element 110. The capacitor 135 is coupled between the second side of the transformer 133 and the second side of the transformer 134. In the example of FIG. 4, the reference circuit 150 includes a first transformer 154, a second transformer 155, and a capacitor 156, and, optionally, a reference impedance $Z_{ref}$. A first side of the transformer 155 is coupled to a probe signal terminal P of the reference measurement circuit 122. A first side of the transformer 154 is coupled to a reference terminal R of the reference measurement circuit 122. On one end, a second side of the transformer 133 and a second side of the transformer 134 are coupled directly to each other. On the other end, the capacitor 135 is coupled between the second side of the transformer 133 and the second side of the transformer 134. The transformers 154, 155 and the capacitor 156 thus couple the probe signal terminal P of the reference measurement circuit 122 to the reference terminal R of the reference measurement circuit 122. The transformer 154 may replicate characteristics of the transformer 133, e.g., may have a similar number of windings, similar inductance values, or the like. The transformer 155 may replicate characteristics of the transformer 134, e.g., may have a similar number of windings, similar inductance values, or the like. The capacitor 156 may replicate characteristics of the capacitor 135, e.g., may have a similar capacitance. The optional reference impedance $Z_{ref}$ may replicate the impedance of the passive sensing element 110 at a certain voltage U, however without depending on the voltage U between the measurement point 101 and the reference point 102.

In the example of FIG. 4, impedance detector 120 may detect the impedance Z of the passive sensing element 110 in the following way: the measurement circuit 121 outputs the probe signal at the probe signal terminal P of the measurement circuit 121. The probe signal may for example be a rectangular pulse or sequence of rectangular pulses. Further, the measurement circuit 121 receives a first response to the probe signal at the measurement terminal M of the measurement circuit 121. The reference measurement circuit 122 outputs the probe signal at the probe signal terminal P of the reference measurement circuit 122. Further, the reference measurement circuit 122 receives a second response to the probe signal at the reference terminal R of the reference measurement circuit 122. The first response reflects the transfer function $H_m$ of the circuit formed by the AC coupling circuit 130, i.e., the transformers 133, 134 and the capacitor 135, and the passive sensing element 110. The second response reflects the transfer function formed by the reference circuit 150, i.e., the transformers 154, 155 and the capacitor 156. Since the transformers 154, 155 and the capacitor 156 may replicate characteristics of the transformers 133, 134 and the capacitor 135, the second response may reflect similar characteristics as a circuit formed of the AC coupling circuit 130 without the passive sensing element 110. The second response may thus for example also reflect effects of changing temperature or aging in a similar manner as the first response.

In the example of FIG. 4, the measurement circuit 121 provides information on characteristics of the transfer function $H_m$ to the evaluation circuit 123. This information may for example include information on a phase shift, frequency shift, and/or amplitude variation of the first response with respect to the probe signal. In a similar manner, the reference measurement circuit 122 provides information on characteristics of the transfer function $H_r$ to the evaluation circuit 123. This information may for example include information on a phase shift, frequency shift, and/or amplitude variation of the second response with respect to the probe signal. Based on the received information, the evaluation circuit 123 determines the impedance Z of the passive sensing element 110. This may involve determining a difference between the information received from the measurement circuit 121 and the information received from the reference measurement circuit 122, e.g., a phase difference, a frequency difference, and/or an amplitude difference.

In some scenarios, for example, if a change of the characteristics of the coupling elements 131, 132 or 133, 134, e.g., due to aging, process variation, temperature, or the like, can be neglected as compared to effects of the voltage applied to the passive sensing element, the reference measurement circuit 122 of FIG. 3 or 4 may be omitted. In this case, the reference circuit 150 may deliver a previously stored reference response, e.g. during a calibration phase with known voltages applied to the passive sensing element 110.

Figure 5:
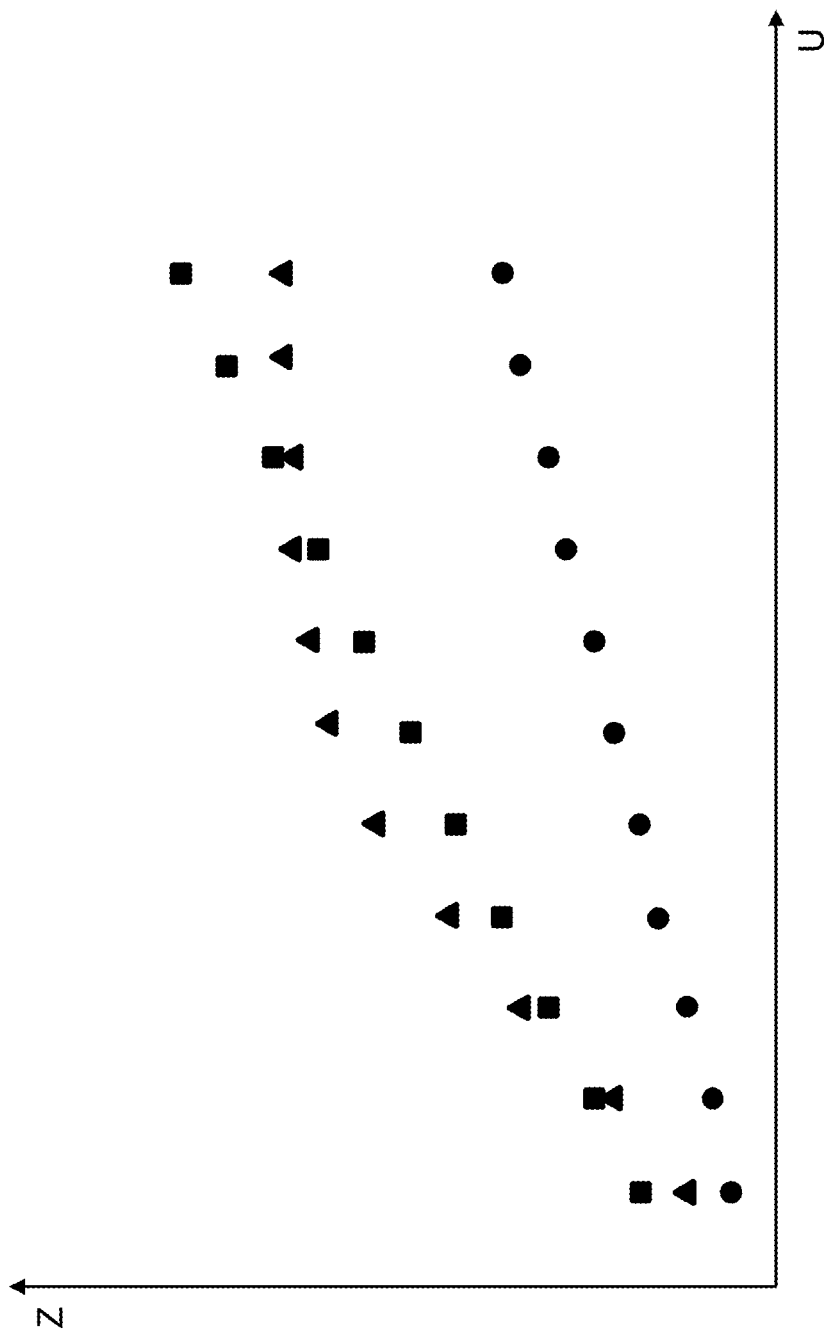
FIG. 5 shows exemplary impedance characteristics of sensing elements which may be utilized according to an embodiment.

FIG. 5 illustrates exemplary impedance characteristics of passive sensing elements which may be utilized in the measurement circuit. In particular, FIG. 5 illustrates a dependency of the detected impedance Z and the voltage U between the measurement point 101 and the reference point 102. In FIG. 5, solid circles and solid squares represent linear dependencies which may for example be achieved by using a varactor as the passive sensing element 110. The different slopes of the linear dependency may be due to different construction or doping profile of the varactors. Further, in FIG. 5 solid triangles illustrate a non-linear, saturating dependency which may for example be achieved by using a power MOS field effect transistor or diode as the passive sensing element 110. The measurement circuit 100 may include a memory, e.g., a non-volatile memory like a flash memory, an EEPROM (electrically erasable programmable read-only memory), or an OTP (one time programmable) memory which stores information representing the characteristic of the passive sensing element 110. For example, the information representing the characteristic of the passive sensing element 110 may be stored in a table relating values of the voltage U to values of the impedance. In some scenarios, the measurement circuit 100 may also interpolate between the stored values. The stored information representing the characteristic of the passive sensing element 110 can be measured during manufacture of the measuring circuit 100, e.g., in a production test phase. Alternatively or in addition, the stored information representing the characteristic of the passive sensing element 110 could also be measured in a calibration mode of the measurement circuit 100.

In some scenarios, rather than using the impedance Z, other values used in the impedance evaluation, e.g., the phase shift, frequency, attenuation, or the like, may be stored as reference information for known voltages U at the passive sensing element 110. In some scenarios, these values may be directly used to determine the applied voltage U instead of determining an impedance value as intermediate result.

The measurement circuit 100 of the illustrated examples may be applied in various scenarios. For example, the measurement circuit 100 could be used for measuring an output voltage of a high voltage battery, e.g., a battery having an output voltage in the range of 400V to 800V, as for example used in hybrid or electric vehicles. The measurement point 101 and the reference point 102 could then correspond to terminals of the battery. The impedance detector 120, the converter 140, and typically one or more further control devices receiving the measured value $U_m$ of the voltage U, may then be located in a low voltage domain, e.g., defined with respect to a chassis ground of the vehicle. The battery may be isolated from the low voltage domain, e.g., isolated from chassis ground of the vehicle.

In some applications, e.g., in DC/DC converters, motor drives, or the like, it may not be required to measure the voltage U with a high precision. For example, it could also be sufficient to get an indication about a voltage range in which the voltage U currently is or an indication about a trend of the voltage U, e.g., whether the voltage is increasing or decreasing. The latter could for example indicate whether a switch is fully closed or opened, whether a fuse is blown, whether capacitor is discharged, whether an isolation is intact or shows leakage, or the like. In such scenarios, the measurement circuit 100 can offer an efficient solution because it can be implemented with low complexity and low manufacturing cost. The elements of the AC coupling circuit 130, the impedance detector 120, and the converter 140 may be formed in a single integrated circuit. In this case, the capacitors of the AC coupling circuit may for example be isolated by oxide layers. The transformers used in the example of FIG. 4 may be efficiently implemented in the integrated circuit by using a coreless transformer (CT) technology.

Figure 6:
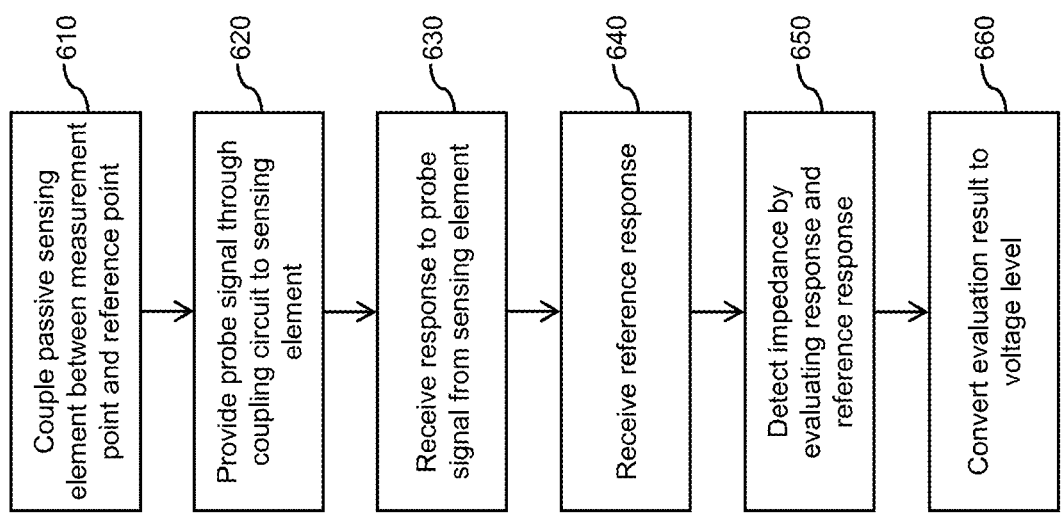
FIG. 6 is flowchart illustrating a method according to an embodiment.

FIG. 6 shows a flowchart for illustrating a method of measuring a voltage. The method may be used to implement the above-described concepts. The method may for example be implemented in the above-described measurement circuit 100.

At 610, a passive sensing element is coupled between a measurement point and a reference point. The passive sensing element has a voltage-dependent impedance. The passive sensing element may, for example, correspond to the above-mentioned passive sensing element no. The measurement point may correspond to the above-mentioned measurement point 101. The reference point may correspond to the above-mentioned reference point 102. The passive sensing element may for example correspond to or include a varactor, a varicap diode, and/or a field effect transistor.

At 620, a probe signal is provided through a coupling circuit to the passive sensing element. Further, the probe signal may be provided to a reference circuit. The probe signal may be a pulse signal, e.g., having a substantially rectangular waveform. The probe signal may have a constant frequency. In some scenarios, the frequency of the probe signal may be selectable from a plurality of frequencies.

The reference circuit may, for example, correspond to the reference circuit 150 as illustrated in the examples of FIG. 1, 2, 3, or 4. The coupling circuit provides DC decoupling with respect to the passive sensing element. The coupling circuit may, for example, correspond to the AC coupling circuit 130 as illustrated in the examples of FIG. 1, 2, 3, or 4. The coupling circuit may be based on capacitive coupling, e.g., like illustrated in the examples of FIGS. 1, 2, and 3, or on inductive coupling, e.g., like illustrated in the examples of FIG. 4. Further, the coupling circuit could also be based on a combination of capacitive coupling and inductive coupling. The reference circuit may be configured to replicate an impedance of the coupling circuit.

At 630, a response to the probe signal is received through the coupling circuit from the passive sensing element. At 640, a reference response to the probe signal is received from a reference circuit. The reference response may be received from a reference circuit that has been stimulated similarly to the passive sensing element, e.g., to which the probe signal was supplied at 620. Accordingly, in some scenarios, the probe signal may be provided to the reference circuit and the reference response be received as a further response to the probe signal from one or more circuit elements, e.g., such as the elements 151, 152, 153, 154, 155, 156, $Z_{ref}$, of the reference circuit. Further, the reference response may be defined by previously stored information, e.g. during a calibration phase. The reference response may thus be based on a previous measurement and stored in the reference circuit.

At 650, the impedance of the passive sensing element is detected by evaluating the response and the reference response. In some scenarios, the response and the reference response may be evaluated by determining a difference between the response and the reference response, e.g., a phase difference, a frequency difference, and/or an amplitude difference.

At 660, the result of evaluating the response and the reference response, e.g., an impedance value or a difference of the response and the reference response, is converted to a voltage level information. In some scenarios, this may involve determining the voltage level information based on a mapping of differences between the response and the reference response to corresponding voltage level information. Such mapping may, for example, be based on a characteristic of the passive sensing element as illustrated in FIG. 5. The voltage level information determined at 660 may represent a value of the voltage between the measurement point and the reference point. In addition or as an alternative, the voltage level information may represent the voltage in terms of an indicator that the voltage between the measurement point and the reference point is above a certain threshold, an indicator that the voltage between the measurement point and the reference point is below a certain threshold, or an indicator that the voltage between the measurement point and the reference point is within a certain voltage range. In some examples, the voltage level information may be represented in terms of an analog signal, e.g., a voltage signal or a current signal. In other examples, the voltage level information may be represented in terms of a digital signal, e.g., in a binary-coded data word encoding a numerical value and/or a logic state.

It is to be understood that embodiments as explained above may be subject to various modifications. For example, the measurement circuit 100 may be used in various applications where measurement of a voltage across an isolating barrier to a separate voltage domain is needed. Further, various ways of coupling the impedance detector 120 to the passive sensing element 110 could be utilized. Still further, the measurement circuit 100 could be implemented on the basis of various types of passive sensing elements having a voltage-dependent impedance. Various types of circuit technology may be used for implementing the measurement circuit 100 or components thereof.

What is claimed is:

1. A circuit for measuring a voltage, the circuit comprising:
a passive sensing element configured to be coupled between a measurement point and a reference point, the passive sensing element having a voltage-dependent impedance that depends on a first voltage applied to the passive sensing element;
a reference circuit configured to provide a reference response;
an impedance detector configured to detect the voltage-dependent impedance of the passive sensing element by providing a probe signal to the passive sensing element and evaluating a response to the probe signal from the passive sensing element and the reference response provided by the reference circuit; and
a converter circuit configured to convert a result of evaluating the response and the reference response to voltage level information corresponding to the first voltage applied to the passive sensing element.

2. The circuit according to claim 1,
wherein the probe signal has a constant frequency.

3. The circuit according to claim 1,
wherein the probe signal is a pulse signal.

4. The circuit according to claim 1, wherein the impedance detector is configured to evaluate the response and the reference response by determining a difference between the response and the reference response.

5. The circuit according to claim 4, wherein the converter circuit is configured to determine the voltage level information by mapping the determined difference between the response and the reference response to a corresponding voltage level information.

6. The circuit according to claim 4, wherein the difference between the response and the reference response comprises a phase difference.

7. The circuit according to claim 1, further comprising:
a coupling circuit configured to allow passage of the probe signal from the impedance detector to the passive sensing element and provide direct current decoupling between the passive sensing element and the impedance detector.

8. The circuit according to claim 7, wherein the coupling circuit is configured to capacitively couple the passive sensing element and the impedance detector.

9. The circuit according to claim 7, wherein the coupling circuit is configured to inductively couple the passive sensing element and the impedance detector.

10. The circuit according to claim 7, wherein the reference circuit is configured to replicate an impedance of the coupling circuit.

11. The circuit according to claim 1, wherein:
the impedance detector is further configured to provide the probe signal to the reference circuit, and
the reference response is a further response to the probe signal from one or more circuit elements of the reference circuit.

12. The circuit according to claim 1, wherein the reference circuit is configured to store a result of a previous measurement and to output the reference response based on the stored result of the previous measurement.

13. A method of measuring a voltage, the method comprising:
coupling a passive sensing element between a measurement point and a reference point, the passive sensing element having a voltage-dependent impedance that depends on a first voltage applied to the passive sensing element;
providing a probe signal to the passive sensing element;
receiving a response to the probe signal through a coupling circuit from the passive sensing element;
receiving a reference response from a reference circuit;
detecting the voltage-dependent impedance of the passive sensing element by evaluating the response and the reference response; and
converting a result of said evaluating the response and the reference response to a voltage level information corresponding to the voltage applied to the passive sensing element.

14. The method according to claim 13, wherein the probe signal has a constant frequency.

15. The method according to claim 13, wherein the probe signal is a pulse signal.

16. The method according to claim 13, wherein said evaluating the response and the reference response comprises determining a difference between the response and the reference response.

17. The method according to claim 16, wherein the voltage level information is determined by mapping the difference between the response and the reference response to a corresponding voltage level information.

18. The method according to claim 16, wherein the difference between the response and the reference response comprises a phase difference.

19. The method according to claim 13, further comprising:
providing the probe signal to the reference circuit and receiving the reference response as a further response to the probe signal from one or more circuit elements of the reference circuit.

20. The method according to claim 13, wherein the reference response is based on a result of a previous measurement and stored in the reference circuit.

21. The method according to claim 13, further comprising providing the probe signal through the coupling circuit to the passive sensing element, the coupling circuit providing direct current decoupling with respect to the passive sensing element.

22. A voltage measurement system, comprising:
an impedance measurement circuit configured to apply a first AC signal to a first probe signal terminal and measure a response to the applied first AC signal at a first measurement terminal;
a first AC coupling circuit;
a varactor coupled to a voltage measurement input and to the first probe signal terminal and to the first measurement terminal of the impedance measurement circuit via the first AC coupling circuit;
a reference measurement circuit configured to apply a second AC signal to a second probe signal terminal and measure a response to the applied second AC signal at a second measurement terminal;
a second AC coupling circuit;
an impedance reference element coupled to the second probe signal terminal and the second measurement terminal of the reference measurement circuit via the second AC coupling circuit; and
an evaluation circuit coupled to the impedance measurement circuit and to the reference measurement circuit, the evaluation circuit configured to determine an impedance of the varactor based on the measured response to the first AC signal and the measured response to the second AC signal.

23. The circuit of claim 1, further comprising a coupling network configured to apply the first voltage to the passive sensing element.

24. The circuit of claim 23, wherein the coupling network comprises a plurality of resistors.

25. The method of claim 13, further comprising applying the first voltage to the passive sensing element.

\* \* \* \* \*